United States Patent [19]

Kabashima et al.

[11] Patent Number: 4,550,289
[45] Date of Patent: Oct. 29, 1985

[54] SEMICONDUCTOR INTEGRATED CIRCUIT DEVICE

[75] Inventors: Katsuhiko Kabashima, Kawasaki; Yoshihiro Takemae, Yokohama; Shigeki Nozaki; Tsuyoshi Ohira, both of Kawasaki; Hatsuo Miyahara, Yokohama; Masakazu Kanai, Yokohama; Seiji Enomoto, Yokohama, all of Japan

[73] Assignee: Fujitsu Limited, Kawasaki, Japan

[21] Appl. No.: 453,115

[22] Filed: Dec. 27, 1982

[30] Foreign Application Priority Data

Dec. 29, 1981 [JP] Japan .................. 56-214815

[51] Int. Cl.[4] ............................. G01R 31/22
[52] U.S. Cl. ........................ 324/158 R; 324/73 R
[58] Field of Search ................ 324/73 R, 51, 158 R; 371/15, 25; 340/644, 514–516

[56] References Cited

U.S. PATENT DOCUMENTS

| | | | |
|---|---|---|---|
| 3,851,161 | 11/1974 | Sloop | 324/73 R |
| 4,241,307 | 12/1980 | Hong | 324/73 R |
| 4,336,495 | 6/1982 | Hapke | 324/73 R |
| 4,395,767 | 7/1983 | Van Brunt et al. | 324/73 R |

FOREIGN PATENT DOCUMENTS 2448724 2/1980 France .
2,448,723 2/1980 France .
2,455,287 3/1980 France .

OTHER PUBLICATIONS

Collins, "Logic Network Nodal Conductance", *IBM Tech. Disc. Bull.* vol. 17, No. 12, May 1975, pp. 3666–3668.

*Primary Examiner*—Stewart J. Levy
*Assistant Examiner*—Stephen M. Baker
*Attorney, Agent, or Firm*—Staas & Halsey

[57] ABSTRACT

A semiconductor integrated circuit (IC) device includes therein a test circuit. The test circuit operates to distinguish the power source level during the testing or ground level occurring at an internal node located inside the semiconductor chip. The test circuit includes a series-connected MIS transistor and an MIS diode. The gate of the MIS transistor is connected to the internal node. The MIS diode is connected to an external input/output (I/O) pin. The level at the internal node, i.e., the power source level or the ground level, can be distinguished by a first voltage level or a second voltage level applied to the external I/O pin, whichever enables a current to be drawn from the external I/O pin.

4 Claims, 4 Drawing Figures

Fig. 3A
Fig. 3B
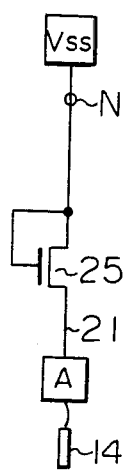
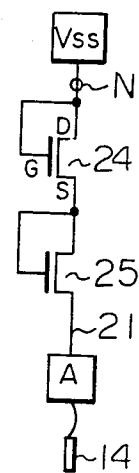

SEMICONDUCTOR INTEGRATED CIRCUIT DEVICE

BACKGROUND OF THE INVENTION

(1) Field of the Invention

The present invention relates to a semiconductor integrated circuit (IC) device, more particularly to a test circuit for an IC device which contains a variety of semiconductor integrated circuits in a chip thereof.

(2) Description of the Prior Art

IC's are usually mass produced for reasons of reduction of unit costs and standardization of capabilities. The economic considerations, etc. make it advantageous to mass produce IC's having a main-semiconductor circuit and a sub-semiconductor circuit as an option at one time. The mass produced optional semiconductor circuits of each IC chip are then selectively made active by prepackaging wire bonding in accordance with individual user needs.

For example, a dynamic metal insulated semiconductor (MIS) memory circuit is generally used together with a socalled refresh counter. The aforesaid main-semiconductor circuit may be used for the dynamic MIS memory circuit, and the aforesaid sub-semiconductor circuit may be used for the refresh counter. Many users, however, may not need the latter circuit. In such cases, the sub-semiconductor circuit is offered as an option. If a user does not need the optional circuit, wire bonding is not effected in the IC manufacturing process.

After packaging, the IC products are usually tested to confirm whether they contain both active main and subsemiconductor circuits or only active main-semiconductor circuits. The IC packages are then labeled according to the results of the tests.

In the confirmation test of the prior art, a predetermined test signal is externally supplied to the IC package under testing to cause the IC to perform an operation based on the signal. If the results of the test confirm the operation of a first function, it is concluded that the IC product has only an active main-semiconductor circuit. However, the results confirm the operation of a second function, it is concluded that the IC product has both active main and sub-semiconductor circuits.

In the prior art, however, whether the IC product includes only a main-semiconductor circuit or both a main-semiconductor circuit, and active sub-semiconductor circuit depends on whether the sub-semiconductor circuit is commonly connected to a pin leading to an external power source. In activating the sub-semiconductor circuit, it is also necessary to connect its input ports to the specified pins of the IC package.

Therefore, in the prior art test, if it is desired to confirm the operation of the second function in the IC, but only the first function operated, there is no way to determine whether both or only one of the wire bondings for connection with the external power source and the input ports are faulty. This is inconvenient in view of IC production management.

SUMMARY OF THE INVENTION

It is an object of the present invention to provide a semiconductor IC device which can correctly discriminate at least whether the power source port of the sub-semiconductor circuit is wire bonded with the pin for the external power source, thereby eliminating the above-mentioned problem.

Further, as will be apparent from the following explanation, it is another object of the present invention to provide a semiconductor IC device including a general purpose test circuit enabling detection of the level at a particular internal node of the IC chip outside of the IC package via a particular external pin thereof.

The above-mentioned objects can be attained by a semiconductor IC device including a test circuit including a series circuit of an MIS transistor and an MIS diode. An internal node to be tested is connected to the gate of the MIS transistor. The MIS diode is connected to an external input/output (I/O) pin. The level at the node, i.e., either ground level or a power source level, is externally detected via the external I/O pin by applying a first or second voltage level thereto and, simultaneously, drawing a current therefrom.

BRIEF DESCRIPTION OF THE DRAWINGS

The present invention will be more apparent from the ensuing description with reference to the accompanying drawings, wherein:

FIG. 3A is an equivalent circuit diagram of the test circuit created under a mode where a second semiconductor IC is active; and FIG. 3B is an equivalent circuit diagram of the test circuit created under a mode where the second semiconductor IC is not active.

DESCRIPTION OF THE PREFERRED EMBODIMENTS

Figure 1:
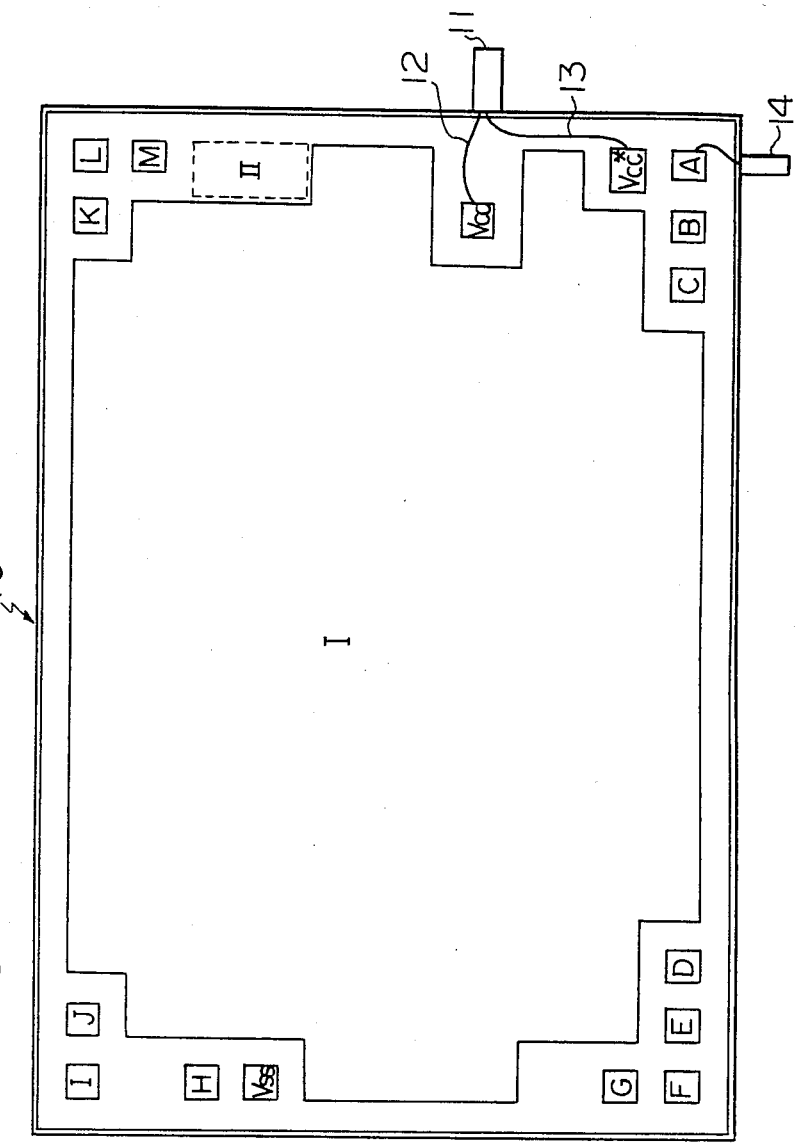
FIG. 1 is a schematic plan view of a semiconductor IC not yet packaged.

FIG. 1 is a schematic plan view of a semiconductor IC not yet packaged. In FIG. 1, reference numeral 10 represents a chip. In and on the chip 10, a first semiconductor IC I (corresponding to a main-semiconductor circuit) and a second semiconductor IC II (corresponding to a sub-semiconductor circuit) are fabricated. Many pads A through M, $V_{cc}$, $V_{cc}^*$ and $V_{ss}$, used for the power supply, communication of I/O signals, and so on, are distributed thereon. Wire bonding is performed between the pads and corresponding external pins. Usually, there are 16 pins. In FIG. 1, however, all the pins and wire bondings are not illustrated.

Of these members, the pads $V_{cc}$ and $V_{cc}^*$ are particularly relevant to the embodiment of the present invention. The pad $V_{cc}$ constitutes a first power source with ground level pad $V_{ss}$. The pad $V_{cc}^*$ constitutes a second power source with ground level pad $V_{ss}$. The first and second power sources drive the first and second semiconductor IC's I and II, respectively. In this case, the pads $V_{cc}$ and $V_{cc}^*$ are commonly connected, through wire bondings 12 and 13, respectively, to a single pin 11 connected to an external power source (not shown). The common pin is preferable in view of economical use of the fixed number of pins. The wire bonding 12 is always provided. The wire bonding 13 is provided in accordance with individual user needs, as previously mentioned.

Incidentally it should be understood that, in FIG. 1, illustration of wirings between the pad $V_{cc}$ and the first semiconductor IC I and also wiring between the pad $V_{cc}^*$, is omitted for brevity.

Below, it will be explained how the embodiment of the present invention enables external detection of the wire bonding after the semiconductor chip is packaged.

Figure 2:
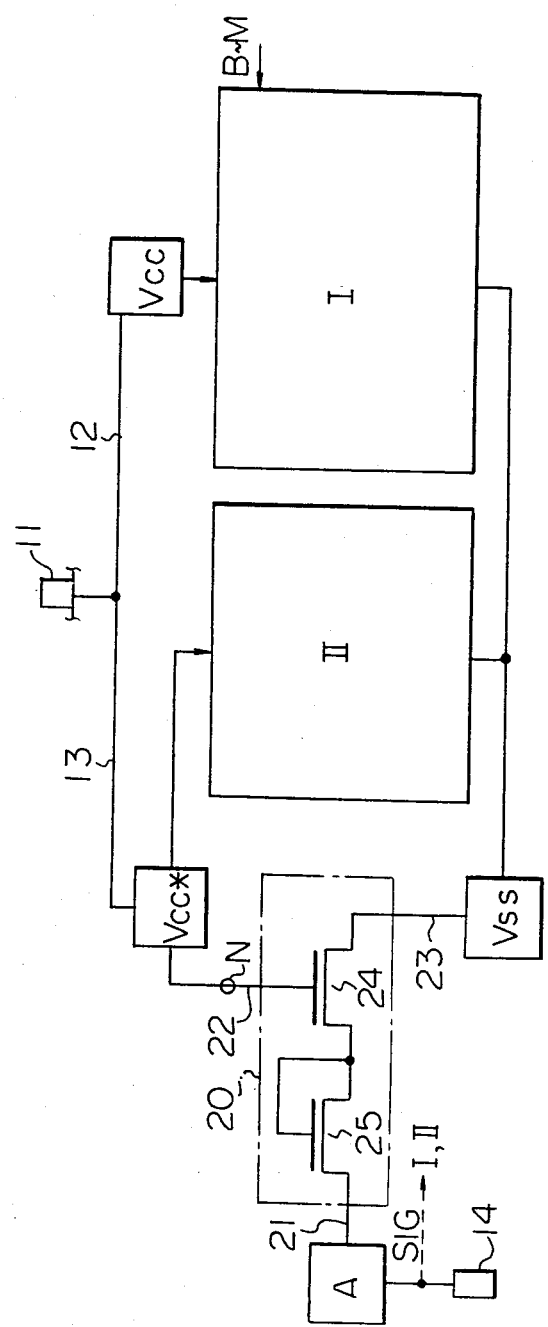
FIG. 2 is a circuit diagram of a semiconductor circuit having a test circuit according to an embodiment of the present invention.

FIG. 2 is a circuit diagram of a semiconductor circuit having a test circuit according to an embodiment of the present invention. In FIG. 2, parts the same as FIG. 1 are represented by the same reference numerals or characters in FIG. 2, a block 20 indicated by chain-dotted lines represents a test circuit, a particularly important part of the present invention. The test circuit 20 is connected to the pad A, the pad $V_{cc}^*$ and the pad $V_{ss}$ via newly employed lines 21, 22, and 23, respectively. The pad A is just an example; any other pad may be used instead. The pad A is connected to an external I/O pin 14.

The test circuit 20 comprises a series-connected MIS transistor 24 and an MIS diode 25. The gate of the MIS transistor 24 is connected to the line 22. It should be noted that in the embodiment of the present invention, the test circuit 20 functions to detect the existence of the wire bonding 13. From the viewpoint of the general purpose application of the present invention, however, the test circuit 20 funtions to detect the level at an internal node N under testing, in which either ground level ($V_{ss}$) or the power source level ($V_{cc}$) occurs at the pad $V_{cc}^*$ (or at the internal node N to be tested).

FIG. 3A is an equivalent circuit diagram of the test circuit created under a mode where the second semiconductor IC II is active. FIG. 3B is an equivalent circuit diagram of the test circuit created under a mode where the second semiconductor IC II is not active. As previously, mentioned, according to the embodiment of the present invention, the existence of the wire bonding 13 shown in FIG. 1 is detected by way of an external I/O pin. Similarly, from a general purpose point of view, the power source level or ground level occuring at the internal node N is dectected by way of the external I/O pin 14.

When the wire bonding 13 exists in the chip, the pad $V_{cc}^*$ is activated, thereby turning on the MIS transistor 24 via the line 22. Similarly, when the node N is activated at the power soruce level, the MIS transistor 24 is turned on. Such a mode corresponds to the equivalent circuit diagram of the test circuit shown in FIG. 3A.

On the other hand, when the wire bonding 13 does not exist in the chip, the pad $V_{cc}^*$ is not activated. At this time, since the pad $V_{cc}^*$ is also connected, via a resistor having high resistance (not shown) to ground, the pad $V_{cc}^*$ is set at ground level. Therefore, the level of the second power source for the second semiconductor IC II is set at ground level. Accordingly, ground level is applied to the gate of the MIS transistor 24. Similarly, when the node N is set at ground level, ground level is applied to the gate of the MIS transistor 24. Such a mode corresponds to the equivalent circuit diagram of the test circuit shown in FIG. 3B.

That is, the MIS transistor 24 substantially forms a conductive path if the internal node N is at the power source level and substantially forms a transistor in which the gate (G) and drain (D) thereof are electrically shorted if the internal node is at ground level. The symbol S denotes a source of the MIS transistor 24.

Thus, the existence of the wire bonding 13, similarly the power source level or ground level at the internal node N, can be determined by investigating whether the equivalent circuit diagram of FIG. 3A or FIG. 3B exists. The circuit modes of FIG. 3A and FIG. 3B can be distinguished by observation from the pad A. In practice, such observation is achieved via the external I/O pin 14 connected to the pad A inside of the chip. It should be noted that the pin 14 works as a test pin during a test mode, but as an I/O signal pin during a normal operation mode.

In carrying out the test mode, a current is drawn from the external I/O pin 14. Under the circuit mode of FIG. 3A, i.e, with the wire bonding 13 or with application of the power source level to the internal node N, to draw a current requires application of a first voltage level lower than the threshold voltage $V_{th}$ of the MIS diode 25, to the pin 14. Thus, if a level of $-V_{th}$ is applied to the pin 14 and a current flows through the pin 14, one may conclude that the circuit mode of FIG. 3A is created in the chip.

However, under the circuit mode of FIG. 3B, i.e., with no wire bonding 13 or with application of ground level to the internal node N, to draw a current requires application of a second voltage level, lower than the sum of the threshold voltages $V_{th}$ of the MIS diode 25 and MIS transistor 24, to the pin 14. Thus, if a level of $-2V_{th}$ is applied to the pin 14 and a current flows through the pin 14, one may conclude that the circuit mode of FIG. 3B is created in the chip.

Thus, the existence of the wire bonding 13, similarly the power source level or ground level at the internal node N, can easily be distinguished by the voltage level ($-V_{th}$ or $-2V_{th}$) applied to the pin 14. In this case, the MIS diode 25 functions as a diode for preventing a flow of a reverse current to the test circuit 20 during a normal operation mode. That is, the MIS diode 25 is set to a reverse biasing state during application of an ordinary I/O signal SIG, indicated by a broken line arrow in FIG. 2, from the pin 14.

As explained above, the power source level or ground level occurring at an internal node in the semiconductor IC chip can be correctly externally distinguished via the external I/O pin.

We claim:

1. A semiconductor integrated circuit device fabricated in and on a single chip having a normal operation mode and a test mode, and having at least one external input/ouput/detection (I/O/D) pin operatively connected to receive a first or second voltage level, comprising:

at least one internal test node selectively having one of a ground level and a power source level in accordance with the mode of the device; and a test circuit formed in the single chip, comprising:

a MIS transistor having a gate operatively connected to said at least one internal test node, having a drain operatively connected to ground level and having a source, said MIS transistor selectively having one of a first threshold voltage and a second threshold voltage, the second threshold voltage being higher than said first threshold voltage in accordance with said at least one internal test node, respectively being at the power source level or ground level; and a MIS diode, operatively connected in series between said source of said MIS transistor and the at least one external I/O/D pin, said MIS diode being reverse biased during the normal operation mode, said test circuit determining whether the ground level or the power source level is at said at least one internal test node, in accordance with a detection of the first voltage level or the second voltage level applied to the at least one external I/O/D pin, and capable of drawing a current therefrom, the first voltage level and the second voltage level being outside the range between the power source level and ground level.

2. A semiconductor integrated circuit device as set forth in claim 1, wherein the first voltage level corresponds to a plus and minus threshold level of said MIS transistor and MIS diode when said at least one internal test node is at the power source level and the second voltage level corresponds to two times the minus threshold level when said at least one internal test node is at ground level.

3. A semiconductor integrated circuit as set forth in claim 2, wherein said MIS transistor substantially forms a conductive path if said at least one internal test node is at the power source level and substantially forms a transistor in which said gate and drain are electrically shorted if said at least one internal test node is at ground level.

4. A semiconductor integrated circuit as set forth in claim 3, further comprising a pad mounted on the single chip, wherein said MIS diode and the at least one external I/O/D pin are operatively connected to said pad.

* * * * *